United States Patent
Symanczyk et al.

(12) 
(10) Patent No.: US 8,531,863 B2
(45) Date of Patent: Sep. 10, 2013

(54) METHOD FOR OPERATING AN INTEGRATED CIRCUIT HAVING A RESISTIVITY CHANGING MEMORY CELL

(75) Inventors: Ralf Symanczyk, München (DE); Corvin Liaw, München (DE)

(73) Assignee: Adesto Technologies Corporation, Sunnyvale, CA (US)

( * ) Notice: Subject to any disclaimer, the term of this patent is extended or adjusted under 35 U.S.C. 154(b) by 1294 days.

(21) Appl. No.: 11/133,716

(22) Filed: May 20, 2005

(65) Prior Publication Data

US 2006/0265548 A1 Nov. 23, 2006

(51) Int. Cl.
- G11C 11/00 (2006.01)
- G06F 12/00 (2006.01)
- G06F 13/00 (2006.01)
- G06F 13/28 (2006.01)

(52) U.S. Cl.
USPC .......................................... 365/148; 711/106

(58) Field of Classification Search
None
See application file for complete search history.

(56) References Cited

U.S. PATENT DOCUMENTS

| | | | |
|---|---|---|---|
| RE37,259 E * | 7/2001 | Ovshinsky | 365/163 |
| 2003/0156468 A1 | 8/2003 | Campbell et al. | |
| 2004/0044841 A1 | 3/2004 | Gilton | |
| 2004/0071012 A1 | 4/2004 | Gilton et al. | |
| 2005/0007852 A1 | 1/2005 | Moore et al. | |

FOREIGN PATENT DOCUMENTS

| | | |
|---|---|---|
| EP | 0455238 | 11/1991 |
| JP | 08306192 | 11/1996 |

OTHER PUBLICATIONS

Derwent, Derwent abstract of supplied Patent EP 0 455 238, pp. 1-4.*
IEEE, The Authoritative Dictionary of IEEE standard terms, 2000, 7$^{th}$ ed., p. 69.*
Weis et al., Certified translation of 1990 DE-4014151, 8 pages.*
M. Kozicki et al., Non-Volatile Memory Based on Solid Electrolytes, Proceedings Non-Volatile Memory Technology Symposium (2004).
International Search Report for European Application No. 06007543. 9-2210 dated Sep. 15, 2006.
M. N. Kozicki, M. Yun, L. Hilt, A.Singh, Applications of Programmable Resistance Changes in Metal-Doped Chalconides, Electrochemical Society Proc., vol. 99-13 (1999), pp. 298-309.
R. Neale, Micron to Look Again At Non-Volatile Amorphous Memory, Electronic Engineering Design (2002).
B. Prince, Chalcogenic Memories, Emerging Memories—Technologies and Trends, Kluwer Academic Publishers (2002), pp. 254-257.
R. Symanczyk et al., Electrical Characterization of Solid State Ionic Memory Elements, Proceedings of the Non-Volatile Memory Technology Symposium, 17-1, San Diego, CA (2003).

* cited by examiner

Primary Examiner — Christian P Chace
Assistant Examiner — Gary W Cygiel

(57) ABSTRACT

A method for operating a resistivity changing memory including applying a programming voltage to a resistivity changing memory cell to define a programmed state and applying a refresh voltage to the resistivity changing memory cell for maintaining the programmed state of the resistivity changing memory cell. In one embodiment, the refresh voltage is less than the programming voltage.

22 Claims, 7 Drawing Sheets

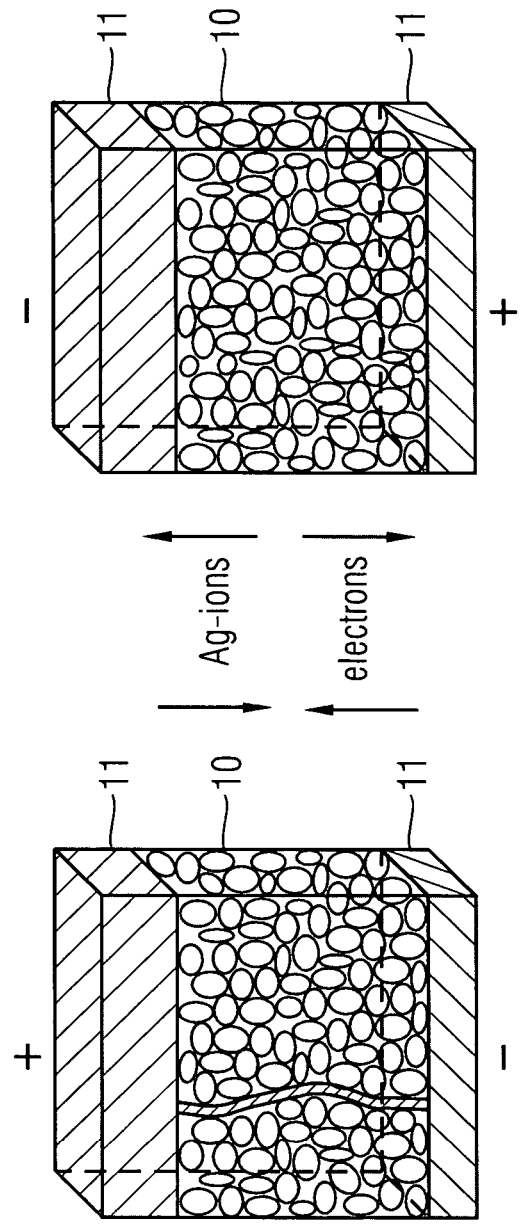

520

510

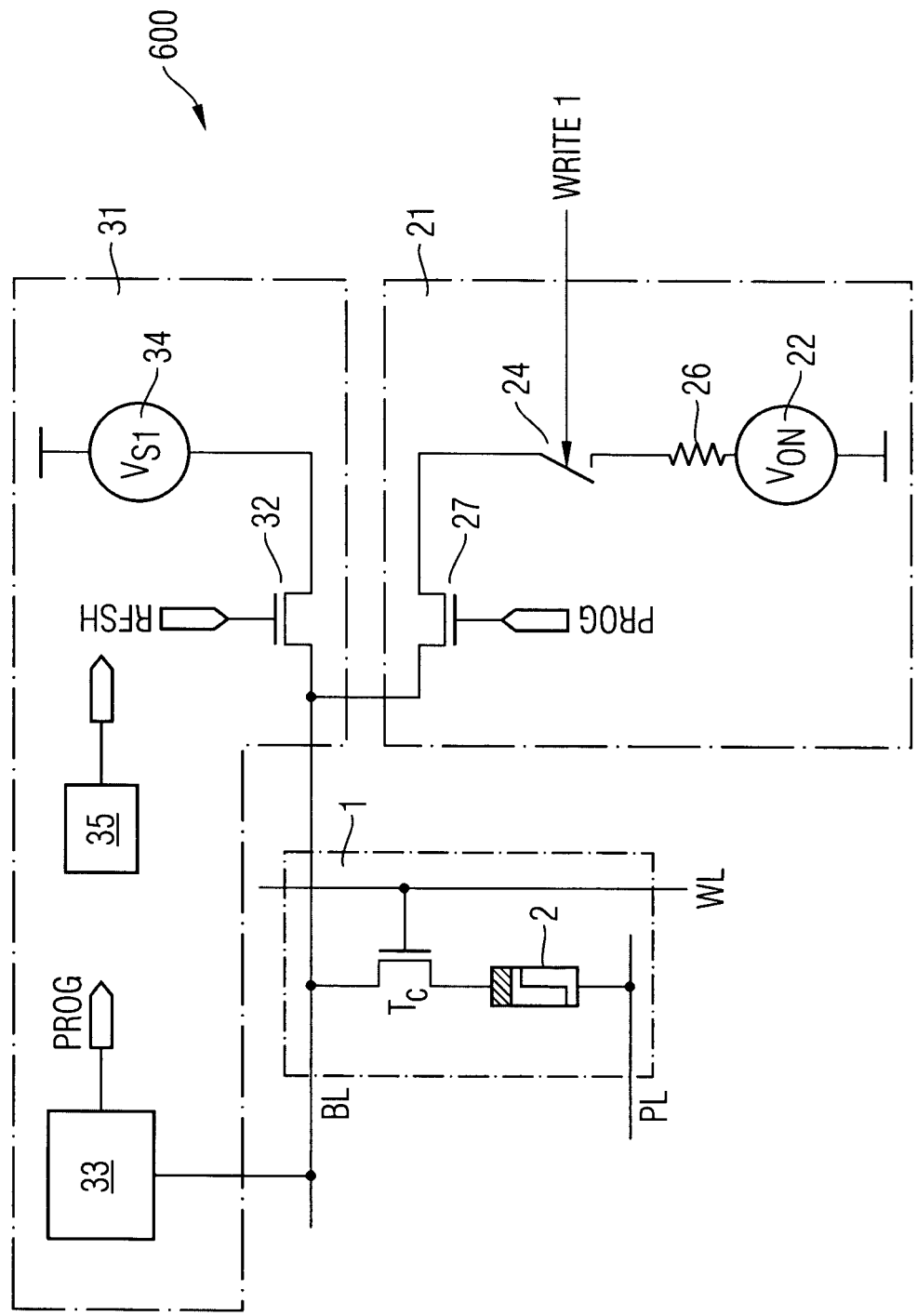

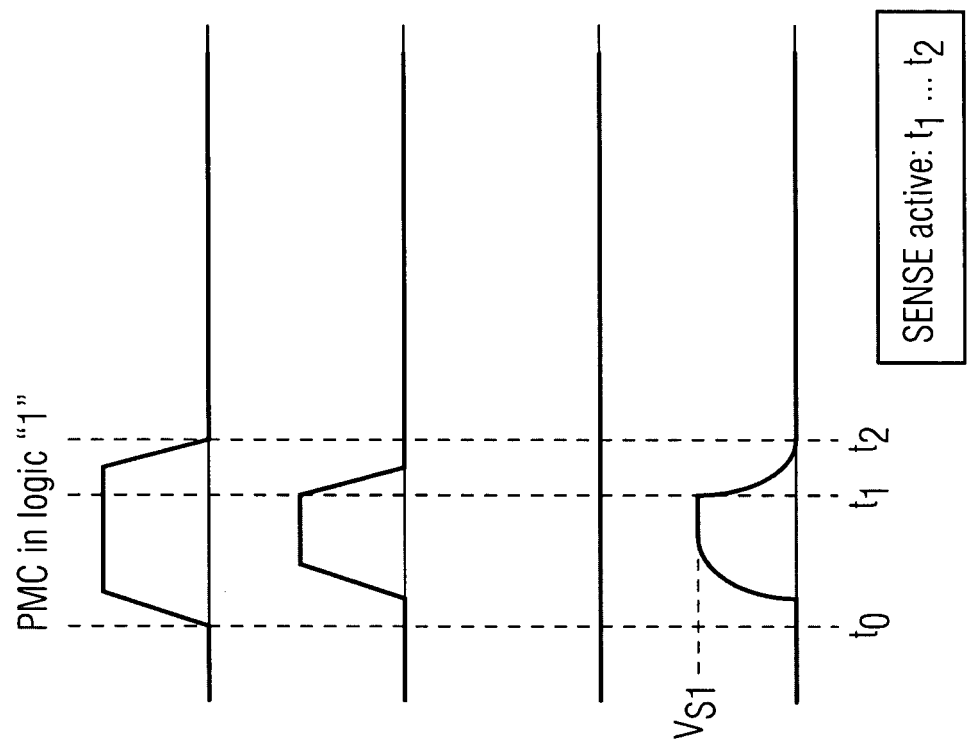
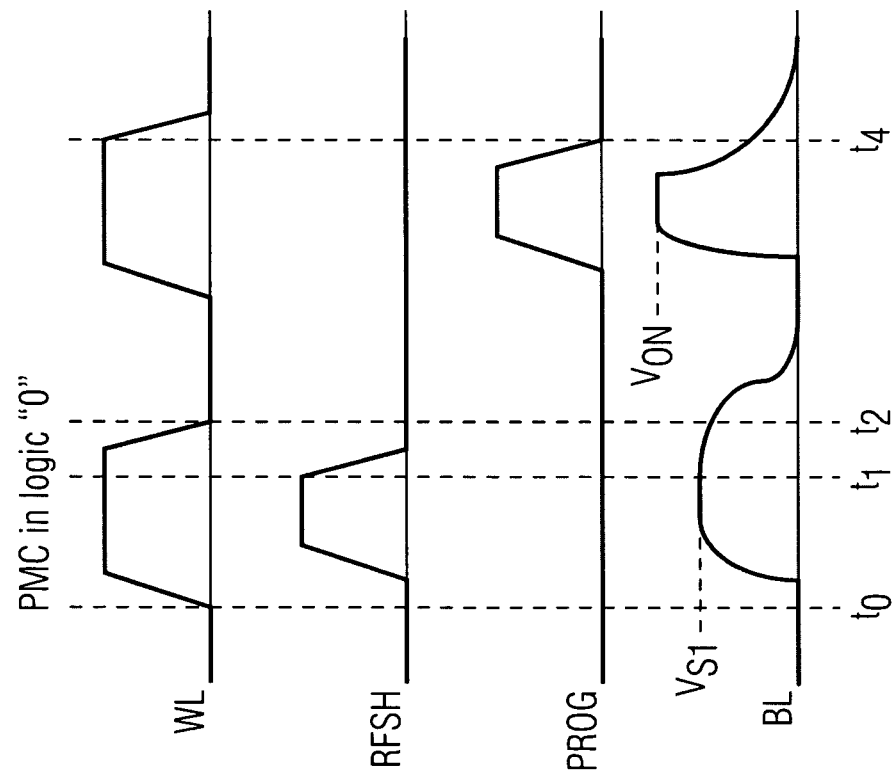

METHOD FOR OPERATING AN INTEGRATED CIRCUIT HAVING A RESISTIVITY CHANGING MEMORY CELL

BACKGROUND OF THE INVENTION

1. Field of the Invention

The present invention relates to a method for operating a PMC memory cell, particularly for use in a CBRAM memory array. The present invention further relates to a CBRAM memory circuit including a CBRAM memory array having at least one PMC memory cell.

2. Description of the Related Art

One type of non-volatile memory cell is a resistivity changing memory cell which utilizes the resistance value of a memory element to store one or more bits of data. One type of resistivity changing memory cell is a phase change memory, which utilizes a phase change material (having an amorphous state and at least one crystalline state) as the resistive element. Another type of resistivity changing memory cell, comprising a solid electrolyte material, is known as PMC (programmable metallization cell) memory cell. Memory devices including such PMC memory cells are known as CBRAM (conductive-bridging random access memory) devices. The storing of different states in a PMC memory cell is based on the developing or diminishing of a conductive path in the electrolyte material between electrodes based on an applied electrical field. Although the electrolyte material has a high resistance, the conductive path between electrodes has a low resistance. Thereby, the PMC memory cell can be set to different states depending on the set resistance of the PMC memory element. Usually, both states of the PMC memory element are sufficiently time-stable in such a way that data may permanently be stored.

A PMC memory cell is being operated by applying a positive or a negative voltage to the solid electrolyte of the PMC memory element. To store data into the PMC memory cell, the PMC memory cell is brought to a programmed state by applying a suitable programming voltage to the PMC memory cell which results in the development of the conductive path in the electrolyte material and therefore in the setting of a first state with low resistance. To store a second state in the PMC memory cell, an erase voltage has to be supplied in such a manner that the resistance of the PMC memory cell changes to a high resistance, which refers to an erased state. To read out a PMC memory cell, a read voltage is applied, and the current through resistance of the PMC memory element is detected and associated to the respective state of the PMC memory cell.

The stability of the stored data in the PMC memory cells over periods of time (retention) is different depending on the state set in the PMC memory element. The erased state having a high resistance is usually time-stable, which means that the high resistance of the PMC memory cell substantially does not degrade. In contrast thereto, the programmed state wherein the conductive path is developed has a more limited retention time, i.e., the value of the resistance of the PMC memory cell increases over time. This effect depends on the start resistance and becomes even worse at higher temperatures. Thus, the resistance windows between the resistances of the first and second states must be increased particularly if the retention time is to be high. Due to the degradation of the programmed state, the reliability of the PMC memory cell is reduced.

Another issue while storing data in the PMC memory cell lies in that an "imprinting" of data occurs if the programming voltage is applied for a successive number of times when the programmed state is to be written into a PMC memory element. The writing of the erased state having a high resistance, is a self-limiting process, i.e., a PMC memory element can be erased for any number of times without any drawbacks. In contrast thereto, a PMC memory element should not be programmed to the programmed state more than once in a row as this results in an irreversible imprinting of the programmed state as the conductive path in the electrolyte material is reinforced every time the programming voltage is applied. The programmed state stored thereby is then "imprinted" and cannot be erased by successively applying the erase voltage.

In the prior art, it is proposed to perform an erasure of the PMC memory cell every time prior to new data being written into the PMC memory cell to avoid an imprinting of a programmed state.

SUMMARY OF THE INVENTION

One aspect of the present invention provides a method for operating a PMC memory cell by which the data retention in the PMC memory cell is enhanced. Furthermore, another aspect of the present invention provides that the method for operating the PMC memory avoids an imprinted programmed state in the PMC memory cell.

In one embodiment, the present invention provides a method for operating a resistivity changing memory cell including applying a programming voltage to the resistivity changing memory cell to define a programmed state and applying a refresh voltage to the resistivity changing memory cell for maintaining the programmed state of the resistivity changing memory cell. In one embodiment, the refresh voltage is less than the programming voltage.

A further aspect of the present invention provides a CBRAM memory circuit having a CBRAM memory array including at least one PMC memory cell wherein the data retention in the PMC memory cell is enhanced.

One embodiment of the present invention relates to a method for operating a PMC memory cell for use in a CBRAM memory array, wherein the PMC memory cell includes a solid electrolyte which is adapted to selectively develop and diminish a conductive path depending on an applied electrical field. The PMC memory cell is programmed to change to a programmed state by applying a programming voltage, and the PMC memory cell is erased to change to an erased state by applying an erase voltage. A refresh voltage is applied to the PMC memory cell at a predetermined time to stabilize the programmed state of the PMC memory cell, wherein the refresh voltage is selected such as that, while applying the refresh voltage, a programming of the PMC memory cell in the erased state to a programmed state is prevented, and that by applying the refresh voltage a stabilizing of the programmed state of the PMC memory cell is performed.

One aspect of the present invention provides that the data window (resistance values) between the programmed and erased state is stabilized by performing a "refreshing step" such that a reliable detection of the stored data is secured. Furthermore, a refreshing of the content of a PMC memory cell can be performed without destroying the content of the PMC memory cell such that a rewriting of the respective state as known from DRAM is not necessary. This means that the non-degrading erased state of a PMC memory cell is not affected by applying the refresh voltage while the programmed state of the PMC memory cell is stabilized when the refresh voltage is applied.

Another aspect of the present invention provides multi-level operation of the PMC memory cell. In case of multi-level operation, the cell can be programmed to different low-resistance levels represented by the formation of paths in the electrolyte with varying conductivity values. Thus, more than one data bit can be stored in one cell. However, the allowable resistance window for each level is tightened (i.e., smaller) in case of multi-level operation compared to normal operation. The method described above of stabilizing the level over time may be utilized to achieve a reliable multi-level capability.

In one embodiment, the refresh voltage is selected to avoid an imprinting of the programmed state in the PMC memory cell. Because an "imprinted" programmed state of the PMC memory cell is avoided by selecting an appropriate refresh voltage, it is no longer necessary to erase the PMC memory cell to the erased state each time before programming it to the programmed state, according to one embodiment. Thus, the refreshing of the PMC memory cell is rendered more quickly because the erasing process for a PMC memory cell is substantially a time-consuming process. Furthermore, the read process can be accelerated as well as the programmed state can be held in a state having a low resistance, thereby avoiding increasing RC time constants which result in increased access times for the PMC memory cell.

In one embodiment, the programming voltage is selected to be equal or higher than a programming threshold voltage.

According to a further embodiment, the refresh voltage is selected from within a voltage range between the programming threshold voltage and a refresh threshold voltage, wherein the refresh threshold voltage is defined as a threshold voltage at which the programmed state of the PMC memory cell is stabilized. As the refresh threshold voltage is usually lower than the programming threshold voltage the refresh voltage is thereby selected from a range wherein an imprinting can be avoided.

The erase voltage may be selected to be equal or lower than an erase threshold voltage, wherein the PMC memory cell is read out by applying a read voltage which is selected from within a voltage range which is defined to be between the erase threshold voltage and the refresh threshold voltage.

In one embodiment, the refresh voltage is repeatedly applied to the PMC memory cell. Furthermore, the refresh voltage may be periodically applied to the PMC memory cell. Moreover, the refresh voltage may be applied to the PMC memory cell every time before the PMC memory cell is to be read out. Furthermore, the refresh voltage may be applied to the PMC memory cell every time before the PMC memory cell is to be written to. According to one embodiment, the state of the PMC memory cell is detected every time the refresh voltage is applied.

In one embodiment, for programming the PMC memory cell, the programming voltage is applied only if it is detected that the PMC memory cell is in the erased state.

According to another aspect of the present invention, a method for operating a CBRAM memory array having a plurality of PMC memory cells is provided. The PMC memory cells may each include a solid electrolyte which is adapted to selectively develop and diminish a conductive path depending on an applied electrical field. A PMC memory cell may be programmed to change to a programmed state by applying a programming voltage thereto and may be erased to change to an erased state by applying an erase voltage. A refresh voltage is applied to one or more of the PMC memory cells at a predetermined time to stabilize the programmed state of the one or more PMC memory cells, wherein the refresh voltage is selected such that, while applying the refresh voltage, a programming of the one or more PMC memory cells in the erased state to a programmed state is prevented, and that, by applying the refresh voltage, a stabilizing of the programmed state of the one or more PMC memory cells is performed.

The method for operating the CBRAM memory array provides that a number of PMC memory cells can be refreshed at a time by applying the refresh voltage to the number of PMC memory cells simultaneously without regard to the state of each of the PMC memory cells.

According to another aspect of the present invention, a CBRAM memory circuit is provided comprising a CBRAM memory array including at least one PMC memory cell, wherein the PMC memory cell includes a solid electrolyte which is adapted to selectively develop and diminish a conductive path depending on an applied electrical field. Furthermore, a writing unit is provided which is adapted to change the state of the PMC memory cell to a programmed state by applying a programming voltage and to change the state of the PMC memory cell to an erased state by applying an erase voltage. By means of a refresh unit which is adapted to apply a refresh voltage to the PMC memory cell at a predetermined time, the programmed state of the PMC memory cell is stabilized. The refresh unit is adapted to output the refresh voltage to the PMC memory cells wherein the refresh voltage is selected such that, while applying the refresh voltage, a programming of the PMC memory cell in the erased state to a programmed state is prevented, and that, by applying the refresh voltage, a stabilizing of the programmed state of the PMC memory cell is achieved.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A and 2B show PMC memory elements as used in PMC memory cells in the CBRAM memory according to FIG. 1 in a programmed state and an erased state, respectively;

FIG. 6 is a CBRAM memory circuit according to one embodiment of the present invention; and FIGS. 7A and 7B are signal-time-diagrams indicating the signals for operating the PMC memory cell depending on the state of the PMC memory cell.

DETAILED DESCRIPTION OF THE PREFERRED EMBODIMENT

As described above, one type of non-volatile memory cell is a resistivity changing memory cell, such as phase change memory cells and PMC memory cells. In FIG. 1A, an example of a PMC memory cell 1 according to the prior art is depicted. The PMC memory cell 1 is a part of a CBRAM memory array 3 including word lines WL, bit lines BL and plate lines PL. The plate line PL is usually set to a predetermined potential known as the plate line voltage. The word line WL is connected to a gate of a cell transistor $T_c$ which is connected in series to a PMC memory element 2. Depending on an activation signal on the word line, a voltage may be applied to a PMC memory element 2, connected between the bit line BL and the plate line PL via an activated cell transistor $T_c$, for writing a state and reading out the stored state into/of the PMC memory cell 1.

Figure 1B:
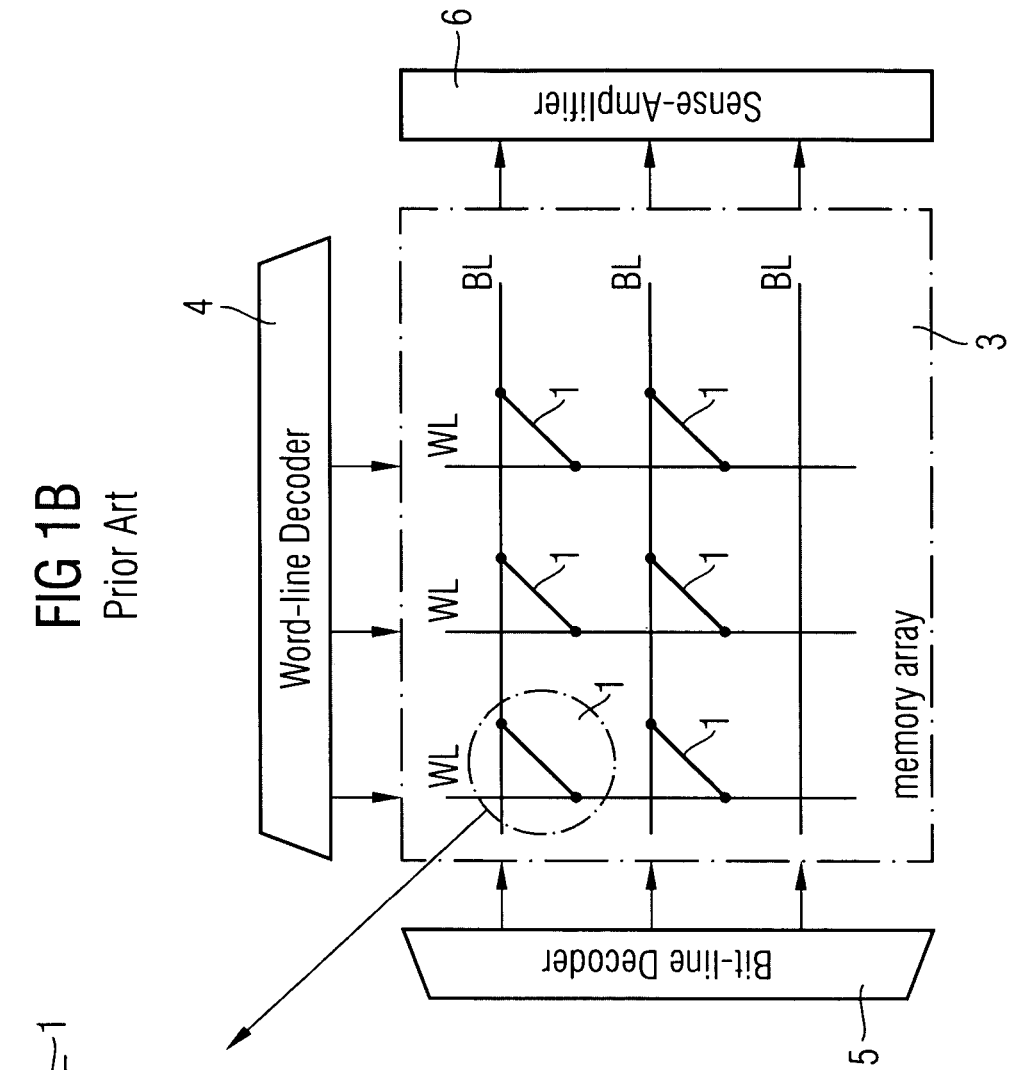
FIGS. 1A and 1B schematically show block diagrams illustrating a prior art CBRAM memory design.
Figure 1A:
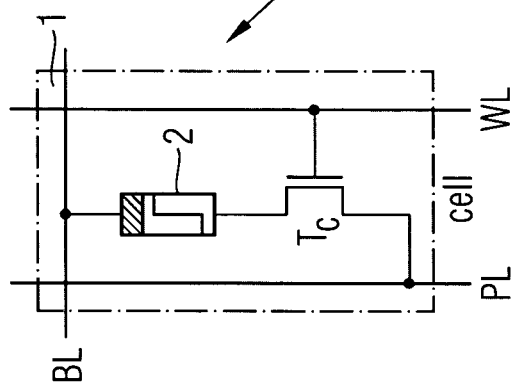

In FIG. 1B, a CBRAM memory array 3 is depicted including a plurality of PMC memory cells 1 as shown in FIG. 1A arranged on word lines WL and bit lines BL. The PMC memory cells 1 are indicated as thicker black line segments between the word lines and bit lines BL for ease of illustration. The PMC memory cells 1 are addressed by means of a word line decoder 4 and a bit line decoder 5, wherein the word line decoder selects a single word line WL according to a word address WA and applies an activation signal to the selected word line WL to close (i.e., turn on or activate) the cell transistor $T_C$ such that the voltage difference between the bit line BL and the plate line PL is applied to the PMC memory element 2. The bit line decoder 5 includes a controllable voltage source which is set such that a voltage between the bit line and the plate line occurs which is selected according to the operation which is to be carried out with the addressed PMC memory cell 1. By means of a sense amplifier 6, the resulting current through the addressed PMC memory cell 1 is detected and a logical state which is stored as the programmed state or the erased state in the PMC memory cell 1 is associated depending on the detected current through the PMC memory cell 1.

As shown in FIGS. 2A and B, the PMC memory element 2 includes a solid electrolyte material region 10 and electrodes 11 arranged on both sides of the electrolyte material region 10. One of the electrodes 11 (anode) includes a material which is able to migrate through the electrolyte material when an electrical field, i.e., a voltage on the electrodes 11, is applied. The other electrode 11 (cathode) is usually inert. For example, suitable solid electrolyte materials include a chalcogenides material and such like. A suitable material for the anode 11 includes silver. By applying an electrical field, the silver ions migrate into the high resistance solid electrolyte material, thereby forming a conductive path which decreases the overall resistance of the PMC memory element 2. In FIG. 2A, a PMC memory element is shown which is in a first state wherein a conductive path of silver is formed in the solid electrolyte material. In FIG. 2B, the conductive path in the solid electrolyte material has diminished while applying an electrical field which is inverted compared to the electrical field applied to form the conductive path. The state of the PMC memory element 2 in which the conductive path is formed is called the programmed state, and the state wherein the conductive path has diminished or vanished due to the migration of the silver ions back to the electrode is called the erased state. In the programmed state, the resistance of the PMC memory element is low while in the erased state, the resistance of the PMC memory element 2 is high. The states of the PMC memory element are usually reversible depending on the applied electrical field.

Figure 3:
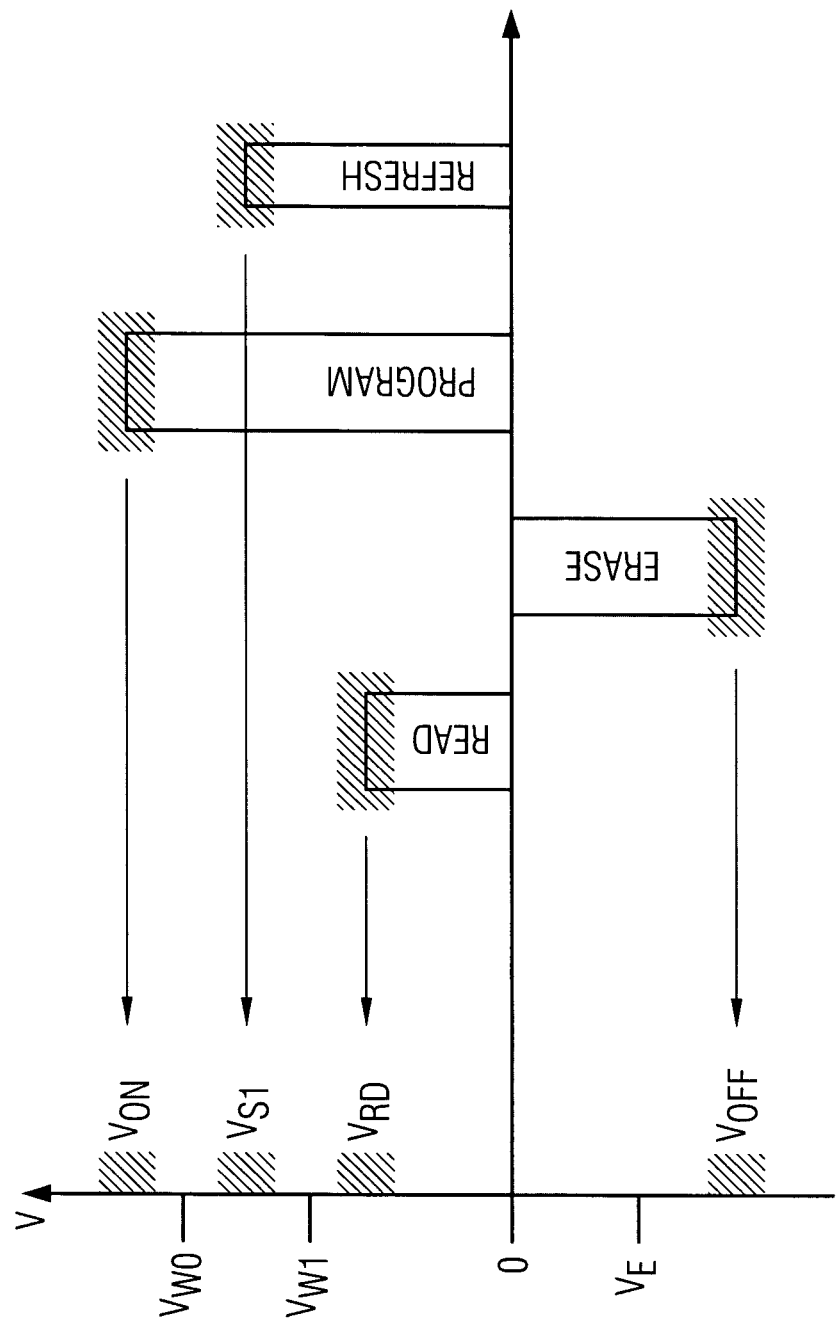
FIG. 3 shows a diagram illustrating the voltage levels by means of which the PMC memory cell is operated according to one embodiment of the present invention.

In FIG. 3, for instance, voltage levels to operate a PMC memory cell 1 according to one embodiment of the present invention are illustrated. The first voltage level (from left to right) is related to a read voltage $V_{RD}$ which is applied to the PMC memory cell 1 to detect if the PMC memory element 2 of the PMC memory cell 1 has a low or high resistance, i.e., to detect if the PMC memory element is in the programmed or in the erased state. As the next illustrated voltage levels, an erase voltage $V_{OFF}$ and a programming voltage $V_{ON}$ are shown which have a voltage level with an inverse sign to each other. In the given example, the erase voltage $V_{OFF}$ is a negative voltage compared to the programming voltage $V_{ON}$. The erase voltage $V_{OFF}$ has a voltage level which is equal or lower than an erase threshold voltage $V_E$. The erase threshold voltage $V_E$ is a voltage level which results in an electrical field which is minimally necessary to change the state of the PMC memory element from a programmed state to an erased state. In the given example, the erase voltage is selected to be lower (i.e., more negative magnitude) than the erase threshold voltage $V_E$ to ensure that the state of the PMC memory element 2 can be securely altered from the programmed state to the erased state. The programming voltage $V_{ON}$ may be applied to change the state of the PMC memory element 2 from the erased state to the programmed state. The programming voltage $V_{ON}$ is selected to be equal or higher than the programming threshold voltage $V_{W0}$ to ensure that the state of the PMC memory element is securely altered to the programmed state. The programming threshold voltage $V_{W0}$ is defined as a voltage which is necessary at least to alter the state of the PMC memory element 2 to the programmed state.

As used by embodiments of the present invention, a further voltage level is provided. Accordingly, a so-called refresh voltage level indicated as $V_{S1}$ is provided to perform a refresh operation of the PMC memory cell as further discussed below. The refresh voltage level $V_{S1}$ may be selected to be within a voltage range between a refresh threshold voltage $V_{W1}$ and the programming threshold voltage $V_{W0}$. The refresh threshold voltage $V_{W1}$ is selected such that a PMC memory element which is in its erased state cannot be affected by applying the refresh voltage pulse such that the erased state is not changed. The read voltage $V_{RD}$ may be selected with its voltage level to be within a range defined by the refresh voltage level $V_{W1}$ and the erased threshold voltage $V_E$ to avoid a refreshing of the state stored in the PMC memory element 2. Alternatively, the read voltage $V_{RD}$ may be selected from the voltage range between the refresh threshold voltage $V_{W1}$ and the programming threshold voltage $V_{W0}$ such that a refreshing is performed with every reading out of the PMC memory cell 2.

Figure 4:
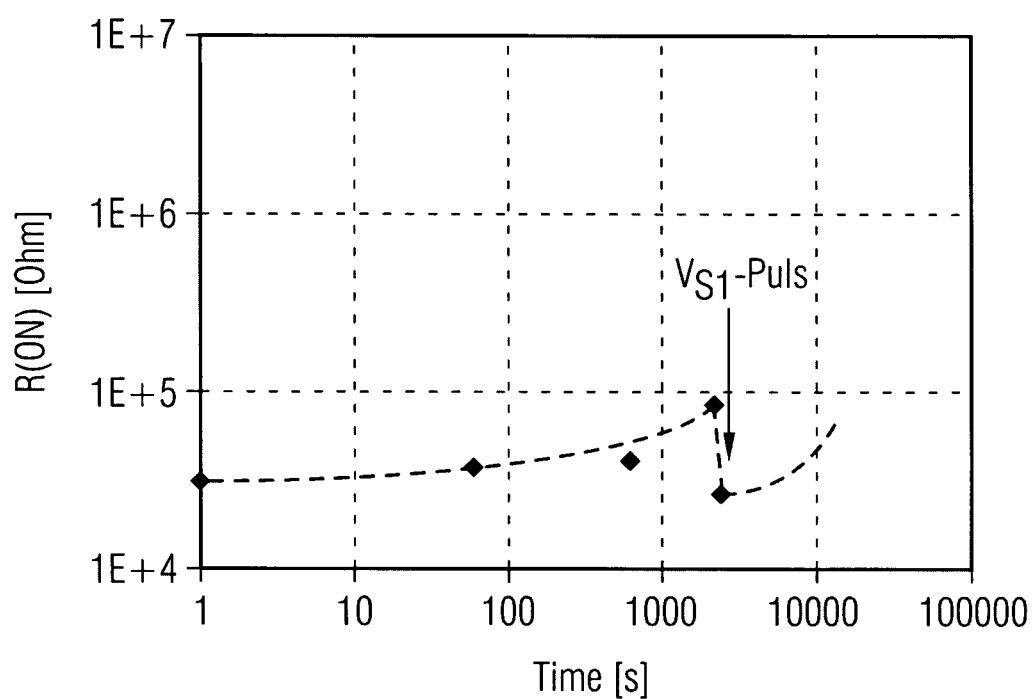
FIG. 4 shows a resistance-time-diagram illustrating the effect of applying the refresh voltage to a PMC memory cell in a programmed state.

The effect of applying the refresh voltage $V_{S1}$ to a PMC memory element 2 is illustrated in the resistance-time-diagram of FIG. 4. The applying of the refresh voltage $V_{S1}$ on the PMC memory element 2 which is in the programmed state results in a stabilizing of the programmed state of the PMC memory element 2. In FIG. 4, the increasing of the resistance of the PMC memory element 2 over periods of time is depicted until a refresh voltage pulse ($V_{S1}$-Puls) is applied which reduces the resistance of the programmed PMC memory element 2 to nearly the resistance level of the PMC memory element held directly after its programming by applying the programming voltage. As particularly PMC memory elements which are in their programmed states are subjected to degradation of their resistances over time, the refresh voltage pulse can "refresh" (or maintain) the content of the PMC memory cell. A refresh voltage to strengthen the erased state of the PMC memory element is not required as the erased state is usually not subjected to degradation. The physical effect of the refresh voltage $V_{S1}$ is to counter the effect of degradation by strengthening the conductive path formed by silver ions in the solid electrolyte material. The refresh voltage is restricted to a voltage level (usually the programming threshold voltage) by which an "imprinting" of the programmed state is avoided. "Imprinting" of the programmed state is called an effect which is a result of applying a voltage as high as the programming voltage for a number of times without bringing the PMC memory cell back to the erased state in between. The repeated application of the programming voltage results in the conductive path being reinforced every time the programming voltage is applied such that the resistance level of the PMC memory element 2 decreases below a certain value which makes it impossible by a driver of any control circuit to apply an inversed electrical field which is sufficiently high to reverse the forming of the conductive path. Therefore, the imprinting results in a PMC memory cell 2 which becomes permanent in the programmed state. Thus, one aspect of the present invention utilizes applications of the refresh voltage to stabilize the programmed state of the PMC memory element 2 without imprinting the programmed state and without altering the erased state to an indifferent or the programmed state.

By repeatedly refreshing the PMC memory cell 1, the resistance window between the erased state and the programmed state in terms of resistance is stabilized. Furthermore, the resistance of the programmed state can be selected to be higher than in PMC memories according to the prior art, with the higher resistance having a lower retention time. Therefore, as the PMC memory cell is subjected to refresh cycles in predetermined time periods, the degradation of the programmed state of the PMC memory element is countered.

The refresh voltage can be applied repeatedly at predetermined times, e.g., by external requests, power-up of the memory circuit, periodically in predetermined intervals and/or coupled to operating processes of the PMC memory cells.

Figure 5B:
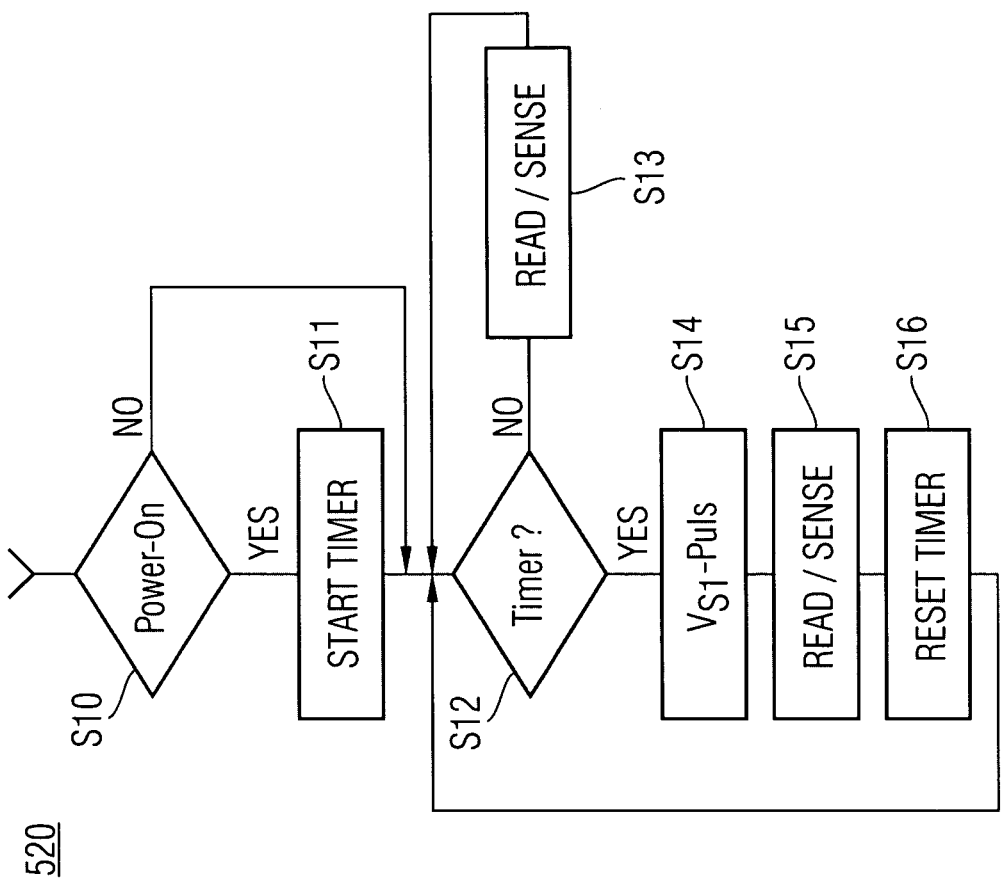
FIGS. 5A and 5B are flow diagrams illustrating methods for operating the PMC memory cell, for writing a programmed state and for reading out the PMC memory cell, respectively.
Figure 5A:
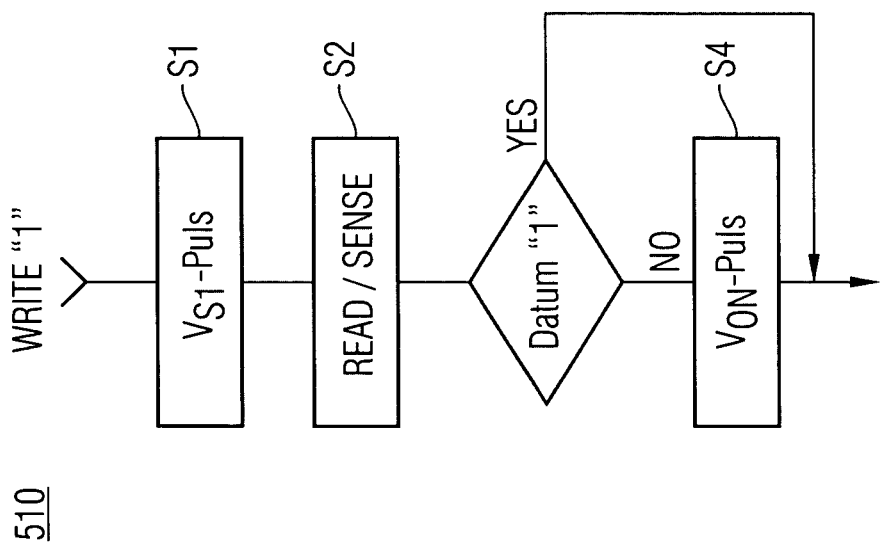

In FIG. 5A, a flow chart is depicted illustrating a method 510 for programming a PMC memory cell to a programmed state. The programming of a PMC memory cell is started by applying the refresh voltage $V_{S1}$ (step S1), for example, in the form of a pulse and such like to stabilize the programmed state of the PMC memory element, as explained before. The refresh voltage pulse is further used to detect the state the PMC memory cells to be read out (step S2). In step S3, it is determined whether the related PMC memory cell 1 is in a programmed state (e.g., Datum=1). If the PMC memory cell 1 is in a programmed state, the next step S4 of reprogramming the PMC memory cell is omitted. Otherwise, if the PMC memory cell is in an erased state, a programming voltage pulse $V_{ON}$ is applied such that the state of the PMC memory cell 1 is altered to the programmed state. This operating method has the advantage that on the one hand, the content of the PMC memory cell or PMC memory cells of the memory circuit may be refreshed and on the other hand, the refresh voltage pulse is used to detect the state the PMC memory cell 1, wherein the detected state is used for the decision whether the programming step S4 has to be applied to store the data. Thus, the programming voltage is not applied when the PMC memory cell is already in the programmed state, such that an imprinting of the programming state can be securely avoided.

The flow chart of FIG. 5B shows a flow chart illustrating a method 520 as an example for applying the refresh voltage pulse while reading out data from the PMC memory cells 1 of the memory circuit. After power-on of the memory circuit in step S10, a timer is started in step 11 which defines a predetermined interval after which a refresh of the PMC memory cell has to be carried out. The predetermined time interval may be set from several minutes to a large number of the days depending on the retention time of the programmed state of the PMC memory cells 1. If no "Power-On" step is required in step S10, the method proceeds to step S12 to determine whether the timer has reached the predetermined timer value. As long as the predetermined timer value has not been reached (step S12), reading out of the data from the PMC memory cells is performed by applying the read voltage $V_{RD}$ to the addressed PMC memory cell (step S13), detecting the current through the PMC memory cell and associating the current state of the PMC memory cell depending on the current. If the timer value has reached a predetermined value (at step S12), a refresh voltage pulse $V_{S1}$-Puls is applied to the addressed or a plurality of PMC memory cells in step S14, thereby refreshing the contents of the PMC memory cells. For reading out of one or more of the refreshed PMC memory cells, the refresh voltage $V_{S1}$ pulse is utilized to detect the current state of the respective PMC memory cells 1 (step S15). After the predetermined timer value is reached and the reading out is performed, the timer is reset and counting is started again (step S16). In one embodiment, a refresh voltage pulse $V_{S1}$-Puls is applied to a plurality of PMC memory cells in step S14 every time the timer has reached the predetermined timer value at step S12. Such periodic refresh scheme may be utilized to maintain the values stored in the PMC memory cells.

In FIG. 6, a CBRAM memory circuit 600 is illustrated. For ease of illustration, the CBRAM memory circuit 600 is shown with only one PMC memory cell 1. It is understood that the CBRAM memory circuit may include a plurality of PMC memory cells arranged in a matrix. The CBRAM circuit may also include an erase circuit (not shown) for providing the erase voltage $V_{OFF}$ to the PMC memory cell when instructed. The CBRAM memory circuit 600 includes a write unit 21 to selectively apply a bit line voltage to the bit line BL which defines the voltage drop over the addressed PMC memory cell 1 with respect to the voltage of the plate line. The write unit 21 includes a programming voltage source 22 which is coupled to a switch 24 by means of a resistor 26. The switch 24 is controlled by a write "1" signal $WRITE_1$ to selectively connect the programming voltage source 22 to an activation transistor 27. If the activation transistor 27 and the switch 24 is closed, the programming voltage source 22 applies the programming voltage $V_{ON}$ to the bit line BL. The activation transistor 27 is controlled by an enable signal PROG provided by a refresh unit.

The refresh unit 31 is also connected to the bit line BL and has a refresh voltage source 34 to provide the refresh voltage $V_{S1}$ to the bit line BL. The refresh unit 31 includes a further activation transistor 32 which, in closed condition, applies the refresh voltage $V_{S1}$ to the bit line BL. The further activation transistor 32 is controlled by a refresh signal RFSH which may be received externally or maybe generated repeatedly or periodically (e.g., utilizing a timer circuit 35) in the refresh unit 31. As described above, the refresh signal RFSH can also be provided according to a power-up signal when powering up the memory circuit.

The enable signal PROG is controlled by the refresh unit 31 in such a way that the programming voltage $V_{ON}$ from the programming voltage source 22 of the write unit 21 and the refresh voltage $V_{S1}$ are not simultaneously applied to the bit line BL.

The refresh unit 31 further comprises a detection unit 33 which may be part of a read unit (not illustrated) for reading out the content of the PMC memory cells of the CBRAM memory array. The content of the PMC memory cell 1 can be read out while applying the refresh voltage pulse $V_{S1}$ as well as the programming and erasing voltage pulses $V_{ON}$, $V_{OFF}$ by the detection unit 33. In one embodiment, the enable signal PROG is provided by the refresh unit 31 if the PMC memory cell is read as a logical "0" (e.g., high resistance) or determined to be in the erased state, and when the PMC memory cell has been programmed to a logical "1" (e.g., low resistance) or determined to be in a programmed state, the enable signal PROG is not supplied to the write circuit 21, thus preventing "imprinting" the PMC memory cell. If a logical "1" is written to the PMC memory cell 1, i.e., the PMC memory cell 1 have been brought to the programmed state, a refresh voltage pulse $V_{S1}$ may be applied to the bit line BL by means of the refresh signal RFSH which closes the further activation transistor 32 such that the refresh voltage source 34 is connected to the bit line BL. The refresh voltage pulse $V_{S1}$ is applied to the bit line BL while the addressed PMC memory cell is or has been activated by a row activation signal on the word line WL.

With reference to the corresponding signal-time-diagrams of the FIGS. 7A and 7B and the circuit shown in FIG. 6, it can be seen that depending on the active refresh signal RFSH and a first active row activation signal pulse, the refresh voltage $V_{S1}$ is applied to the bit line BL. The detection unit 33 detects the state to which the PMC memory cell 2 is set while the refresh voltage pulse $V_{S1}$ is applied to the bit line BL (e.g., sense amplifiers or reading circuit being active between $t_1$ and $t_2$). If it is detected that the PMC memory cell 1 is in an erased state (e.g., PMC in logic "0"), as illustrated by the signal-time-diagram of FIG. 7A, a next row activation signal following the first row activation signal is applied to the word line WL and the enable signal PROG is sent to the write unit 21, thereby closing the activation transistor 27 such that the programming voltage source 22 is applied to the bit line BL. As shown in FIG. 7B, if the detection unit 33 detects that the PMC memory cell 1 is already in the programmed state (e.g., PMC in logic "1"), the enable signal PROG is not generated such that the activation transistor 27 remains open such that no programming voltage is applied to the bit line BL. Therefore, in this case, the applied refresh pulse re-establishes the already present programmed state, and the cell is maintained in the requested low resistance condition.

Embodiments of the present invention provide that the data retention of PMC memory cells can be increased by refreshing the PMC memory cells in their programmed state. An imprinting of the programmed state can be avoided by selecting the refresh voltage $V_{S1}$ such that the conductive path is not irreversibly formed, i.e., formed in such a way that is has a very low resistance which cannot be altered. Furthermore, when the PMC memory cell 1 is to be programmed to the programmed state, a time consuming erasing process can be omitted because it is ensured that the programming of the PMC memory cell 1 is performed only once and that no programming occurs if the PMC memory cell is already in the programmed state.

The application of the refresh voltage pulse $V_{S1}$ to the PMC memory cell 1 can be simultaneously performed in one, more, or all PMC memory cells of the CBRAM memory circuit. According to one embodiment of the present invention, the refresh voltage pulse is applied at least prior to writing data into a PMC memory cell 1 by which the PMC memory cell 1 has to be brought into the programmed state. Furthermore, the reading out of data from the PMC memory cell 1 can also be combined with the applying of the refresh voltage $V_{S1}$ so that the contents of the PMC memory cells are automatically refreshed at least when reading out the PMC memory cells and/or when writing data into the PMC memory cells which is related to the programmed state of the PMC memory elements.

Furthermore, the resistance value of the programmed state of the PMC memory elements can be selected such that the programmed state has a shorter retention time as refreshing steps are provided repeatedly correspondingly to the shorter retention time to avoid the loss of data. This allows the step of programming to be accelerated as the programming voltage pulse may be shorter since the conductive path in the solid electrolyte may require a reduced strength.

Alternatively, the programmed state is realized with a lower resistance so as to obtain lower RC time constants due to a lower resistance of the PMC memory element in the programmed state.

Although described herein primarily with respect to PMC type memory cells, the teachings of the present invention apply and may be adapted for use with other suitable types of resistivity changing memory devices. As such, while the foregoing is directed to embodiments of the present invention, other and further embodiments of the invention may be devised without departing from the basic scope thereof, and the scope thereof is determined by the claims that follow.

What is claimed is:

1. A memory circuit, comprising:
a plurality of memory cells adapted to selectively develop and diminish a conductive path depending upon an applied electrical field;
a refresh unit coupled to the memory cells and configured to apply a refresh voltage to at least a subset of the memory cells in response to predetermined conditions, and including a detection unit configured to read out contents of memory cells in response to the application of the refresh voltage; and
a read unit coupled to the memory cells and configured to read out data from selected memory cells by application of a read voltage; wherein
the read voltage has a different magnitude than the refresh voltage.

2. The memory circuit of claim 1, wherein:
each memory cell comprises a solid electrolyte and is adapted to selectively develop and diminish the conductive path through the solid electrolyte depending upon the applied electrical field.

3. The memory circuit of claim 1, wherein:
the detection unit is shared by the refresh unit and the read unit, and is further configured to read out contents of memory cells in response to the application of the read voltage.

4. The memory circuit of claim 1, further including:
a write unit configured to selectively apply at least one programming voltage to at least a portion of the memory cells in response to read data values generated from the detection unit; wherein
the programming voltage has a different magnitude than the refresh voltage and the read voltage.

5. The memory circuit of claim 1, wherein:
the refresh voltage has a greater magnitude than the read voltage.

6. The memory circuit of claim 1, wherein:
the refresh voltage has the same polarity as the read voltage.

7. The memory circuit of claim 1, wherein:
the refresh unit applies the refresh voltage to at least a subset of the memory cells in response to a power-on of the memory circuit.

8. The memory circuit of claim 1, wherein:
the refresh unit further includes a timer circuit, and is configured to apply the refresh voltage to at least a subset of the memory cells in response to an output of the timer circuit.

9. The memory circuit of claim 1, further including:
a write unit configured to apply at least one write voltage to at least a portion of the memory cells; wherein
the at least one write voltage has a different magnitude than the refresh voltage and the read voltage.

10. The memory circuit of claim 9, wherein:
the at least one write voltage includes a programming voltage and an erase voltage; wherein
the programming voltage and erase voltage have different magnitudes than the refresh voltage and read voltage, and the erase voltage has a different polarity across the memory cells than the read, refresh and program voltages.

11. A method, comprising:
determining if a predetermined time interval has passed;
if the time interval has not passed, applying a read voltage to at least a subset of the memory cells to detect states of the memory cells; and
if the time interval has passed, applying a refresh voltage to at least a subset of memory cells to detect states of the memory cells, the memory cells being adapted to selectively develop and diminish a conductive path depending upon an applied electrical field; wherein
the refresh voltage has a greater magnitude than a read voltage applied to read data from the memory cells.

12. The method of claim 11, wherein:
the memory cells are adapted to develop and diminish conductive paths through an electrolyte material.

13. The method of claim 11, wherein:
the refresh voltage is applied to at least a subset of the memory cells before each read-out operation.

14. The method of claim 11, further including:
selectively applying a program voltage to a memory cell according to the detected state of the memory cell; wherein
the program voltage has a greater magnitude than the refresh voltage.

15. The method of claim 11, further including:
applying different write voltages to the memory cells to develop or diminish conductive paths through the memory cells in response to write data; wherein
at least one of the write voltages has a greater magnitude than the refresh voltage.

16. A method, comprising:
in response to a write instruction to program memory cells, applying a refresh voltage to at least a subset of the memory cells, the memory cells being adapted to selectively develop and diminish a conductive path depending upon an applied electrical field;
detecting the state of at least a subset of the memory cells with the application of the refresh voltage; and
selectively applying the program voltage to a memory cell according to the detected state of the memory cell; wherein
the refresh voltage has a smaller magnitude than a program voltage applied to develop conductive paths in the memory cells, and a greater magnitude than a read voltage applied to determine states of the memory cells.

17. The method of claim 16, wherein:
the memory cells are adapted to develop and diminish conductive paths through an electrolyte material.

18. A method, comprising:
applying a refresh voltage to at least a subset of memory cells, each memory cell having an electrolyte between two electrodes and being programmable between at least a first state and a second state, the second state being more time stable than the first state;
detecting the state of at least a subset of the memory cells with the application of the refresh voltage; and
reading data from at least some of the memory cells by application of a read voltage; wherein
the refresh voltage has a smaller magnitude than at least one program voltage applied to place a memory element in one of the states, the read voltage has a smaller magnitude than the refresh voltage, and
the refresh voltage reinforces the first state.

19. The method of claim 18, wherein:
the refresh voltage reinforces the first state without compromising the second state.

20. The method of claim 18, wherein:
the refresh voltage is applied to at least a subset of the memory cells before each read-out operation.

21. The method of claim 18, further including:
programming a memory cell to the first state by applying a first program voltage; and
selectively applying the first program voltage to a memory cell according to the detected state of the memory cell.

22. A method, comprising:
detecting a state of memory cells by application of a detect voltage; and
selectively applying a second program voltage and not applying a first program voltage to a memory cell according to the detected state of the memory cell; wherein
each memory cell is programmable between at least a first state and a second state by developing and diminishing a conductive path through an electrolyte material,
application of the first program voltage places the memory cell in the first state and application of the second program voltage places the memory cell in the second state,
the first state is more time-stable than the second state; and
the detect voltage is a refresh voltage having a magnitude less than the second program voltage, but greater than a read voltage applied to read data from the memory cell, and the refresh voltage reinforces the second state.

* * * * *